United States Patent
Kim

(10) Patent No.: US 10,755,762 B2
(45) Date of Patent: Aug. 25, 2020

(54) SEMICONDUCTOR DEVICE AND MEMORY MODULE INCLUDING THE SEMICONDUCTOR DEVICE FOR CONTROLLING A REFRESH CYCLE DIFFERENTLY BASED ON ERROR CORRECTION CODE

(71) Applicant: SK hynix Inc., Icheon-si, Gyeonggi-do (KR)

(72) Inventor: Yong Seop Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/213,779

(22) Filed: Dec. 7, 2018

(65) Prior Publication Data
US 2019/0318777 A1 Oct. 17, 2019

(30) Foreign Application Priority Data
Apr. 17, 2018 (KR) ........................ 10-2018-0044339

(51) Int. Cl.
*G11C 11/406* (2006.01)
*G06F 11/10* (2006.01)
(52) U.S. Cl.
CPC .... *G11C 11/40611* (2013.01); *G06F 11/1012* (2013.01); *G11C 11/40626* (2013.01); *G11C 2211/4062* (2013.01)

(58) Field of Classification Search
CPC ......... G11C 11/40611; G11C 11/40626; G11C 11/40618; G11C 2211/4062; G06F 11/1012; G06F 11/1048
See application file for complete search history.

(56) References Cited

U.S. PATENT DOCUMENTS

| 8,588,017 | B2 | 11/2013 | Park et al. | |
| 9,053,813 | B2 | 6/2015 | Kang et al. | |
| 2016/0163372 | A1* | 6/2016 | Lee | G11C 11/406 365/222 |

* cited by examiner

*Primary Examiner* — Sultana Begum
(74) *Attorney, Agent, or Firm* — William Park & Associates Ltd.

(57) ABSTRACT

A semiconductor device includes a counter configured to count a refresh signal and output a counting signal. The semiconductor device may include a mode control circuit configured to receive a first mode signal for controlling a refresh cycle and a second mode signal for constantly controlling a refresh cycle, in correspondence to error correction code information, configured to output an advanced refresh signal in which the refresh cycle is adjusted, by controlling the counting signal depending on the first mode signal, and configured to output a smart refresh signal which has a constant refresh cycle, in correspondence to the second mode signal. The semiconductor device may include a refresh control circuit configured to output a bank address for performing a refresh operation that is set in correspondence to the advanced refresh signal and the smart refresh signal, to a bank.

20 Claims, 7 Drawing Sheets

SEMICONDUCTOR DEVICE AND MEMORY MODULE INCLUDING THE SEMICONDUCTOR DEVICE FOR CONTROLLING A REFRESH CYCLE DIFFERENTLY BASED ON ERROR CORRECTION CODE

CROSS-REFERENCES TO RELATED APPLICATION

The present application claims priority under 35 U.S.C. § 119(a) to Korean Patent Application No. 10-2018-0044339 filed on Apr. 17, 2018 in the Korean Intellectual Property Office, which is incorporated herein by reference in its entirety.

BACKGROUND

1. Technical Field

Various embodiments generally relate to a semiconductor device and a memory module including the semiconductor device, and more particularly, to a technology related to reducing refresh current by controlling a refresh operation.

2. Related Art

Semiconductor memory devices have been continuously developed to increase the degrees of integration and the operation speeds thereof. In order to increase an operation speed, the so-called synchronous memory device capable of operating in synchronization with a clock provided from an exterior of a memory chip has been disclosed in the art.

Among semiconductor memory devices, a DRAM (dynamic random access memory) is a representative volatile memory. The memory cell of the DRAM is constructed by a cell transistor and a cell capacitor.

The cell transistor functions to control an access to the cell capacitor, and the cell capacitor stores charges corresponding to data. That is to say, depending on the amount of charges stored in the cell capacitor, data of a high level or data of a low level is determined.

In the memory cell of such a DRAM, since charges are introduced into or discharged from the cell capacitor due to a leakage component, corresponding data should be cyclically stored again. In this way, an operation cyclically performed to accurately retain data is referred to as a refresh operation.

SUMMARY

In an embodiment, a semiconductor device may be provided. The semiconductor device may include a counter configured to count a refresh signal and output a counting signal. The semiconductor device may include a mode control circuit configured to receive a first mode signal for controlling a refresh cycle and a second mode signal for constantly controlling a refresh cycle, in correspondence to error correction code information, configured to output an advanced refresh signal in which the refresh cycle is adjusted, by controlling the counting signal depending on the first mode signal, and configured to output a smart refresh signal which has a constant refresh cycle, in correspondence to the second mode signal. The semiconductor device may include a refresh control circuit configured to output a bank address for performing a refresh operation that is set in correspondence to the advanced refresh signal and the smart refresh signal, to a bank.

In an embodiment, a memory module may be provided. The memory module may include a plurality of semiconductor devices configured to perform a write or read operation in correspondence to a command signal, an address and data. The memory module may include a controller configured to store and manage the data to be accessed, in the plurality of semiconductor devices. Each of the plurality of semiconductor devices may be differently set in its refresh cycle depending on error correction code information corresponding to error correction codes.

DETAILED DESCRIPTION

Hereinafter, a semiconductor device and a memory module including the same will be described below with reference to the accompanying drawings through various examples of embodiments.

Various embodiments may be directed to a semiconductor device capable of reducing refresh current by differently controlling a refresh cycle depending on an ECC (error correction code) processing capability in a memory module.

According to some embodiments, a refresh current may be reduced by differently controlling the refresh cycle of a semiconductor device depending on an ECC (error correction code) processing capability in a memory module.

While the embodiments have been exemplified, it will be understood by those of ordinary skill in the art that various modifications, changes, replacements and additions could be made therein without departing from the technical spirit and scope of the present disclosure as defined by the claims.

Figure 1:
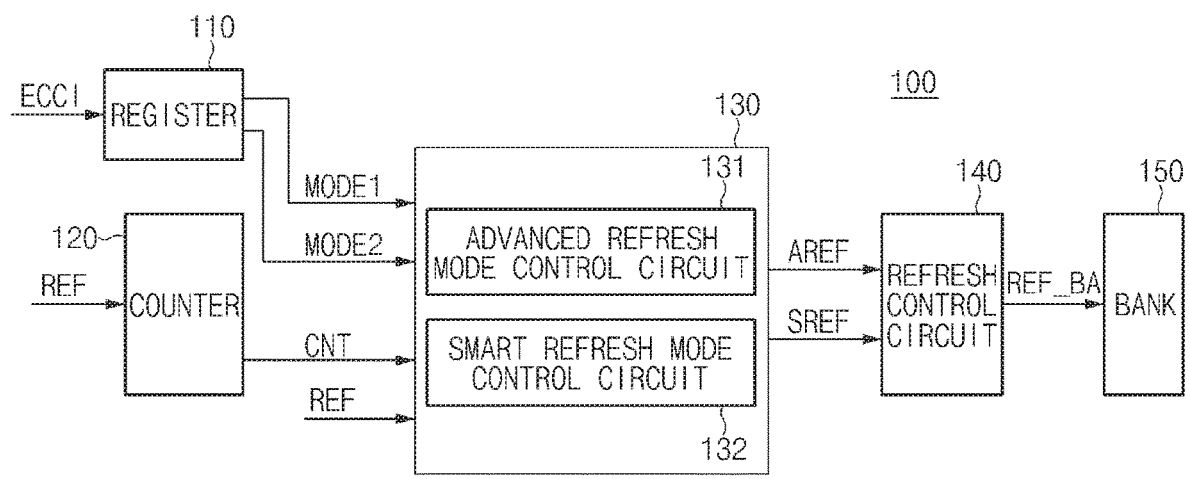
FIG. 1 is a configuration diagram illustrating a representation of an example of a semiconductor device in accordance with an embodiment.

FIG. 1 is a configuration diagram illustrating a representation of an example of a semiconductor device in accordance with an embodiment.

A semiconductor device 100 in accordance with an embodiment includes a register 110, a counter 120, a mode control circuit 130, a refresh control circuit 140 and a bank 150.

The register 110 stores error correction code (ECC) information ECCI, and a refresh mode is set in correspondence to the ECC information ECCI. The register 110 outputs a mode signal MODE1 including advanced refresh mode information in which a refresh cycle is set differently and a mode signal MODE2 including smart refresh mode information which has a constant refresh cycle.

The mode signal MODE1 is a signal for adjusting a refresh cycle in correspondence to the ECC information ECCI. The mode signal MODE2 is a signal for constantly maintaining a refresh cycle according to a setting signal stored in the register 110, regardless of the ECC information ECCI.

In the register 110, a refresh mode may be set in a mode register set (MRS) in correspondence to the ECC information ECCI. For example, the ECC information ECCI may include ECC capability information, and an ECC capability value may be changed depending on an error bit repair capability.

An ECC capability value may be detected by testing in advance an error bit repair capability. The semiconductor device 100 is tested in terms of a performance necessary to access data. By combining test result values of the semiconductor device 100 and calculating a probability, an ECC capability value for the semiconductor device 100 may be set.

That is to say, the semiconductor device 100 may have an error bit repair probability that is relatively higher or lower than chips having standard characteristics, depending on the characteristics thereof. In the case where the ECC capability value of the semiconductor device 100 is high (an error bit repair probability is high), current consumption due to refresh may be reduced since refresh may be performed relatively less. Conversely, in the case where the ECC capability value of the semiconductor device 100 is low (an error bit repair probability is low), refresh should be performed relatively frequently. The ECC information ECCI may be set to a different value in correspondence to an error bit repair probability. In this regard, in a present embodiment, by reflecting an ECC capability value (an ECC efficiency) on the mode signal MODEL a refresh cycle may be set differently depending on the ECC capability value.

In a present embodiment, it is described as an example that a refresh mode is set by using a mode register set. However, it is to be noted that the embodiments are not limited thereto, and a refresh mode may be set by signals inputted from an exterior during the initialization or operation of the semiconductor device 100 or may be set by an information stored in fuses in the manufacturing process of the semiconductor device 100.

In a present embodiment, the mode signal MODE1 may be controlled by setting an FGR (fine granularity refresh) mode and a TCAR (temperature controlled auto refresh) mode in the register 110.

In the case where the mode signal MODE1 is set to the FGR mode, only some word line in the entire bank 150 may be refreshed each time a refresh signal REF is activated. For example, in the FGR mode, each time the refresh signal REF is activated, one word line in the entire bank 150 may be refreshed. Also, in the FGR mode, each time the refresh signal REF is activated, one word line in one half of the entire bank 150 may be refreshed. Moreover, in the FGR mode, each time the refresh signal REF is activated, one word line in ¼ of the entire bank 150 may be refreshed.

In the case where the mode signal MODE1 is set to the TCAR mode, a refresh operation is skipped by neglecting a refresh command at a preset rate depending on temperature information. That is to say, in the TCAR mode, by adjusting the number of refresh operations depending on temperature information, a refresh operation may be performed or passed, and thereby, it is possible to flexibly change a refresh cycle. For example, in the TCAR mode, by decreasing the number of refresh operations as a temperature is lowered, current to be consumed may be reduced.

The counter 120 counts the number of times by which the refresh signal REF is inputted, and outputs a counting signal CNT. The refresh signal REF is activated each time a refresh command signal is applied during a refresh operation period.

The mode control circuit 130 controls the counting signal CNT in correspondence to the mode signals MODE1 and MODE2, and distinguishably outputs an advanced refresh signal AREF and a smart refresh signal SREF.

The mode control circuit 130 includes an advanced refresh mode control circuit 131 and a smart refresh mode control circuit 132. In the case where an advanced refresh mode is activated according to the mode signal MODE1, the advanced refresh signal AREF is activated and outputted according to a preset refresh cycle. Conversely, in the case where a smart refresh mode is activated according to the mode signal MODE2, the smart refresh signal SREF is activated and outputted.

The refresh control circuit 140 outputs a bank address REF_BA for which a refresh operation is to be performed, in correspondence to the advanced refresh signal AREF and the smart refresh signal SREF. For example, in the case where the advanced refresh signal AREF is activated, the refresh control circuit 140 outputs the bank address REF_BA to perform a refresh operation according to a preset refresh cycle. Conversely, in the case where the smart refresh signal SREF is activated, the refresh control circuit 140 outputs the bank address REF_BA to perform a smart refresh operation.

The bank 150 performs an advanced refresh operation or a smart refresh operation in correspondence to the bank address REF_BA. The bank 150 includes memory cell arrays (not illustrated), and a memory cell array corresponding to a selected bank address REF_BA is refreshed.

If the entire bank 150 is refreshed simultaneously in a refresh operation, instantaneous current consumption of the semiconductor device 100 may increase, and due to this fact, problems such as power shortage and noise increase may be caused. Thus, in an embodiment, by decreasing the number of refresh operations in consideration of an ECC capability range, the amount of current to be consumed due to the refresh operations may be reduced.

Figure 2:
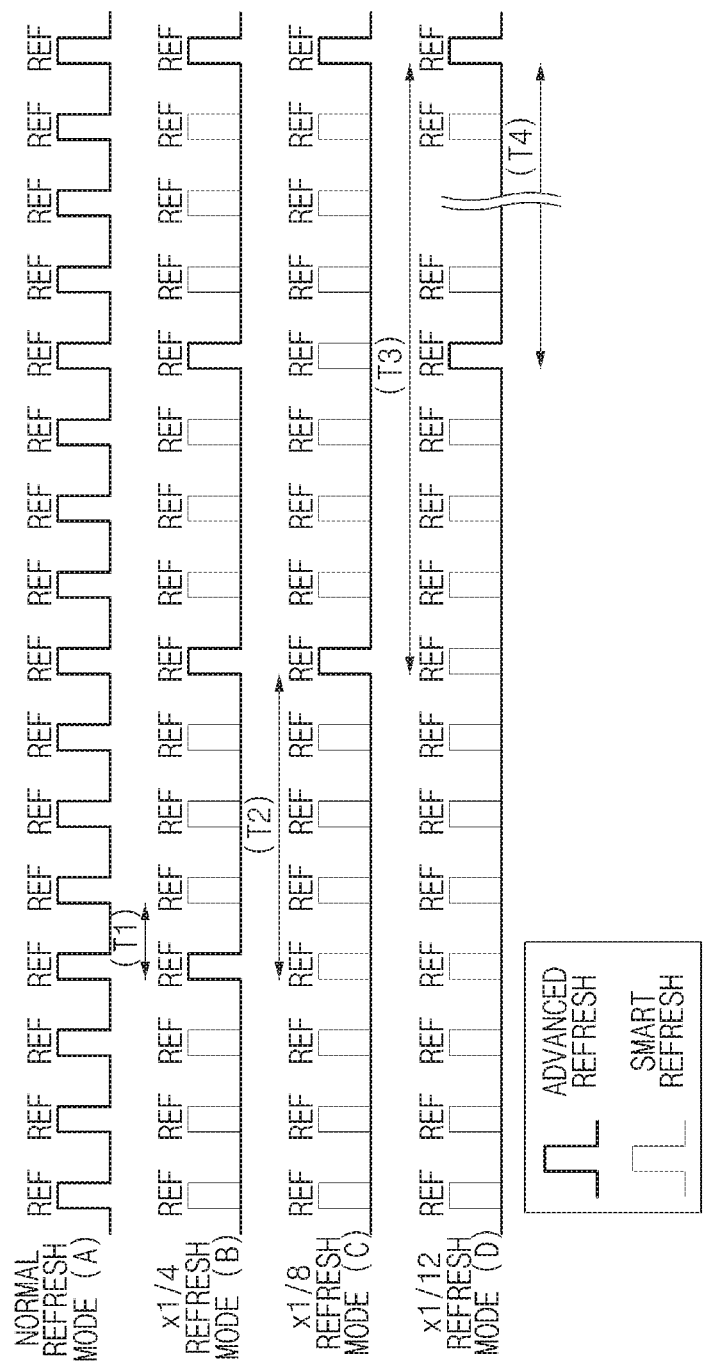
FIG. 2 is a diagram illustrating a representation of an example of the waveforms of refresh operations for the semiconductor device illustrated in FIG. 1.

FIG. 2 is a diagram illustrating a representation of an example of the waveforms of refresh operations for the semiconductor device 100 illustrated in FIG. 1. In the waveform diagram of FIG. 2, the waveform illustrated by the thick solid line represents an operation waveform for the advanced refresh mode, and the waveform illustrated by the thin solid line represents an operation waveform for the smart refresh mode.

In the semiconductor device 100 in accordance with an embodiment, the advanced refresh mode and the smart refresh mode may be executed depending on the mode signals MODE1 and MODE2. In the case where the advanced refresh mode is selected according to the mode signal MODE1, the advanced refresh mode control circuit 131 performs a refresh operation according to a preset refresh cycle. One activation of the refresh signal REF may correspond to one refresh.

For example, in the case where the advanced refresh mode is set as a normal refresh mode, a normal refresh operation is performed in each cycle T1 as illustrated in (A). In the case where the advanced refresh mode is set as a ¼ refresh mode, a refresh operation is intermittently performed in each cycle T2 as illustrated in (B).

In other words, in the ¼ refresh mode, the advanced refresh mode control circuit 131 recognizes only one refresh signal REF among four refresh signals REF by controlling the counting signal CNT. The advanced refresh mode control circuit 131 skips first three refresh signals REF among the four refresh signals REF, and controls the advanced refresh signal AREF to be activated according to the fourth refresh signal REF.

In the case where the advanced refresh mode is set as a ⅛ refresh mode, a refresh operation is intermittently performed in each cycle T3 as illustrated in (C). In other words, in the ⅛ refresh mode, the advanced refresh mode control circuit 131 recognizes only one refresh signal REF among eight refresh signals REF by controlling the counting signal CNT. The advanced refresh mode control circuit 131 skips first seven refresh signals REF among the eight refresh signals REF, and controls the advanced refresh signal AREF to be activated according to the eighth refresh signal REF.

Similarly, in the case where the advanced refresh mode is set as a 1/12 refresh mode, a refresh operation is intermittently performed in each cycle T4 as illustrated in (D). In other words, in the 1/12 refresh mode, the advanced refresh mode control circuit 131 recognizes only one refresh signal REF among twelve refresh signals REF by controlling the counting signal CNT. The advanced refresh mode control circuit 131 skips first eleven refresh signals REF among the twelve refresh signals REF, and controls the advanced refresh signal AREF to be activated according to the twelfth refresh signal REF.

Meanwhile, in the case where the smart refresh mode is selected according to the mode signal MODE2, the smart refresh mode control circuit 132 successively performs refresh operations according to a smart refresh cycle such that a row hammer characteristic is not changed. In other words, the smart refresh mode control circuit 132 cyclically activates the smart refresh signal SREF to conform to a row hammer capability value, in correspondence to the counting signal CNT.

In order for a row hammer issue, smart refresh that allows refresh to be performed for a specific address internally of a DRAM is used. The smart refresh means that a refresh operation is performed each time the refresh signal REF is activated, to solve word line disturbance.

Describing the smart refresh operation more, a word line is activated or deactivated generally through an active operation. However, due to an increase in the degree of integration, a disturbance occurs in a word line which is adjacent to a word line in which an active operation is performed.

Namely, the voltage level of a word line which is positioned adjacent to an activated word line becomes an unstable state. If this is the case, the data stored in a memory cell which is coupled to the adjacent word line may be easily lost. Thus, the smart refresh operation refers to an operation of performing a refresh operation for the adjacent word line, that is, a specific word line, thereby preventing the data from being lost. In an embodiment, such a refresh operation is defined as the smart refresh operation.

Figure 3:
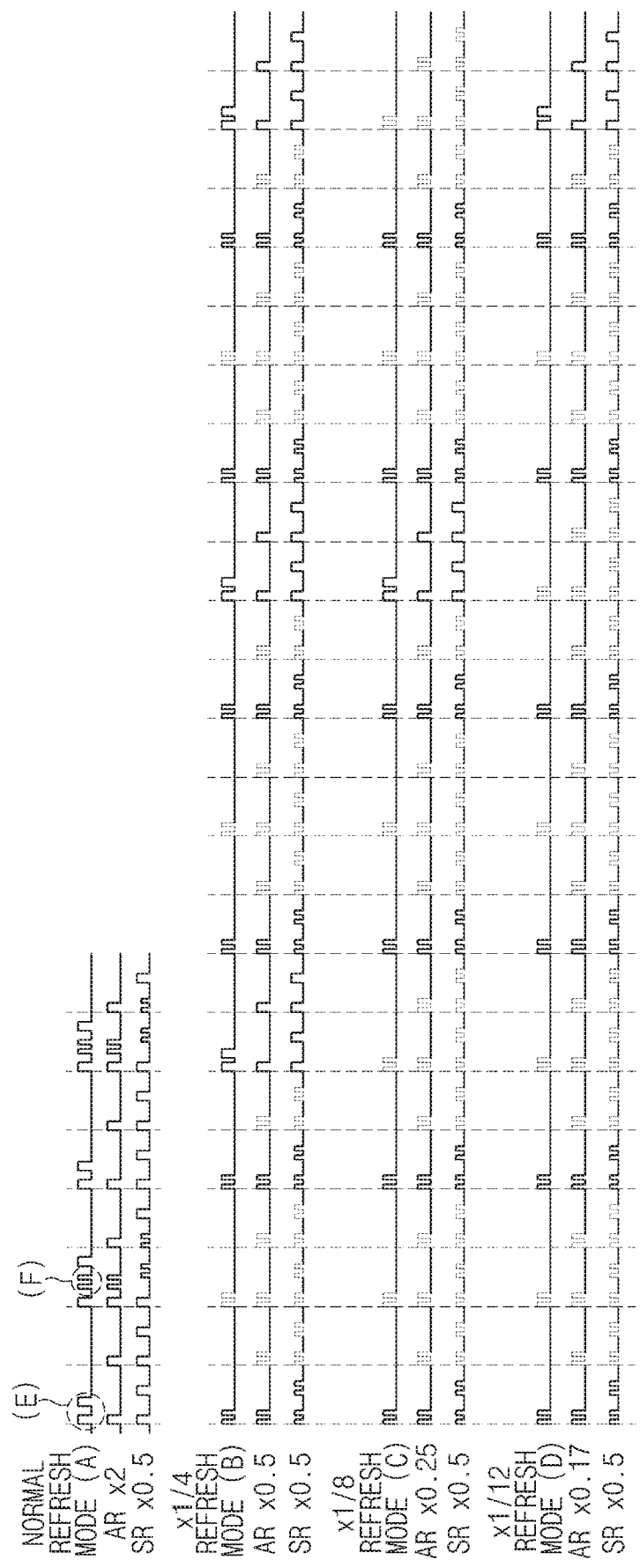
FIGS. 3 to 5 are diagrams illustrating representations of examples of the waveforms of refresh operations for the semiconductor device illustrated in FIG. 1.
Figure 4:
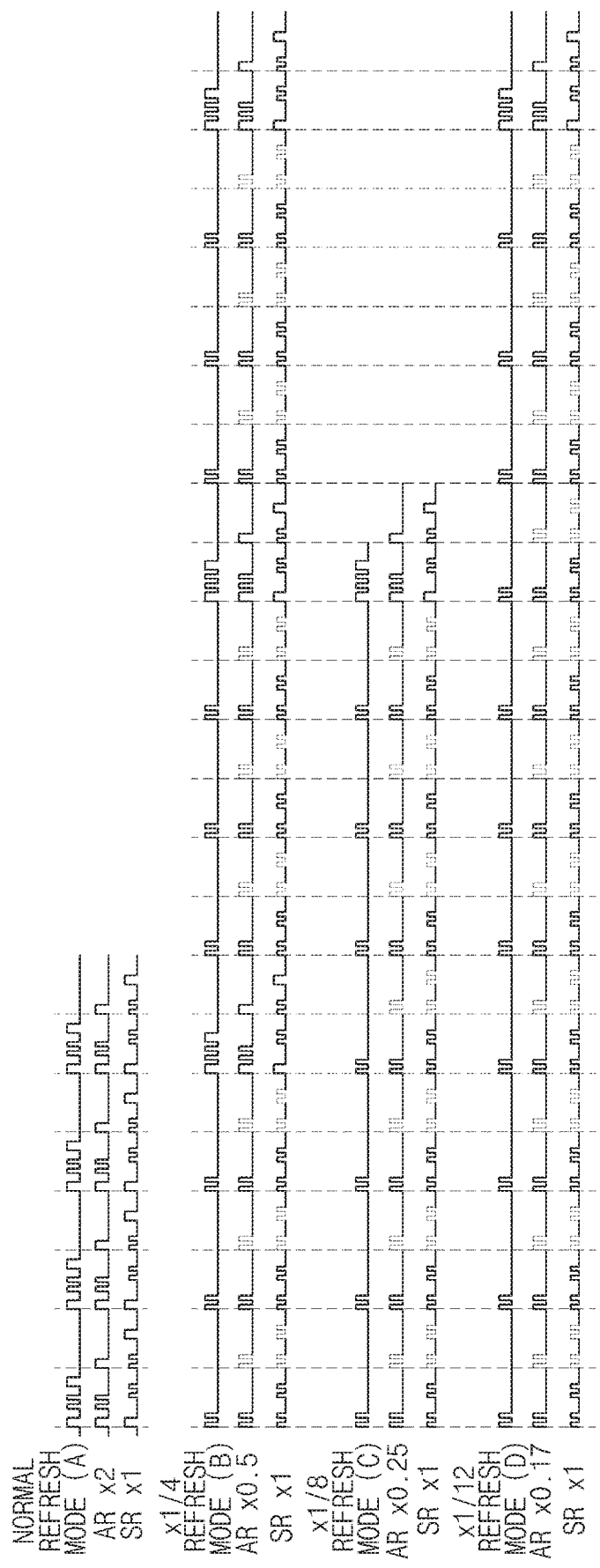
Figure 5:
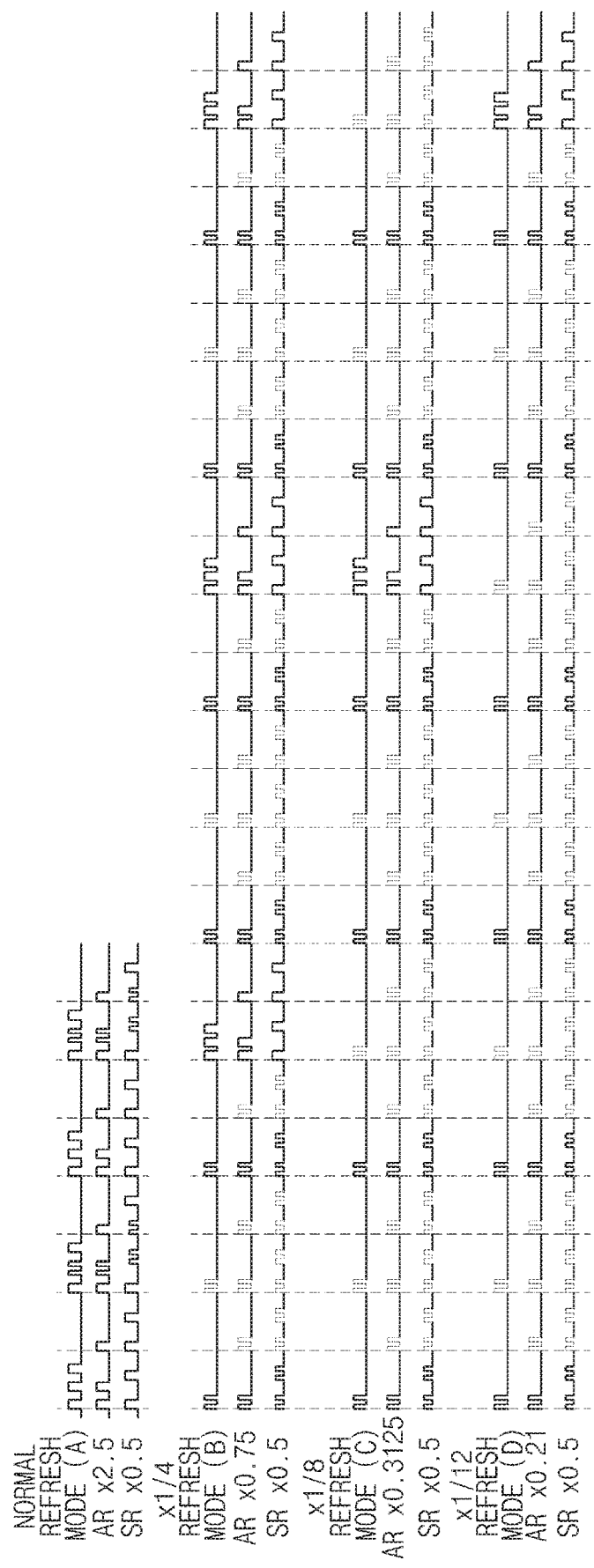

FIGS. 3 to 5 are diagrams illustrating representations of examples of the waveforms of refresh operations for the semiconductor device 100 illustrated in FIG. 1.

The timing diagram of FIG. 3 is a diagram for explaining AR2× and SR0.5× operations. For reference, in AR2×, the number "2" represents the number of times by which the memory bank 150 is refreshed when a refresh command is inputted one time.

Referring to the timing diagram of FIG. 3, advanced refresh operations AR are performed as in (E). Smart refresh operations SR may be performed as in (F) in the middle of performing the advanced refresh operations AR. An advanced refresh operation AR means that a plurality of word lines are enabled during one refresh cycle.

In the case of a normal refresh mode, if a refresh command is applied one time, the entire bank 150 may be refreshed one time. In the case of an advanced refresh mode, when a refresh command is inputted one time, the entire bank 150 may be refreshed more than one time. In this way, the advanced refresh mode may increase the number of refresh times (or decrease a refresh interval) such that the data of memory cells may be retained even in the case where the data retention time of the memory cells is decreased.

In a normal refresh mode (A), during one cycle of a refresh operation, an advanced refresh operation AR is performed two times (×2), and a smart refresh operation SR is performed four times (×0.5).

In a ¼ refresh mode (B), a refresh cycle is slowed to ¼ of the normal refresh mode (A). Due to this fact, the refresh cycle of an advanced refresh operation AR is slowed to ¼ (×0.5).

In a ⅛ refresh mode (C), a refresh cycle is slowed to ⅛ of the normal refresh mode (A). Due to this fact, the refresh cycle of an advanced refresh operation AR is slowed to ⅛ (×0.25).

Similarly, in a 1/12 refresh mode (D), a refresh cycle is slowed to 1/12 of the normal refresh mode (A). Due to this fact, the refresh cycle of an advanced refresh operation AR is slowed to 1/12 (×0.17).

The timing diagram of FIG. 4 is a diagram for explaining AR2× and SR1× operations.

Referring to the timing diagram of FIG. 4, in a normal refresh mode (A), during one cycle of a fresh operation, an advanced refresh operation AR is performed two times (×2), and a smart refresh operation SR is performed two times (×1).

In a ¼ refresh mode (B), a refresh cycle is slowed to ¼ of the normal refresh mode (A). Due to this fact, the refresh cycle of an advanced refresh operation AR is slowed to ¼ (×0.5).

In a ⅛ refresh mode (C), a refresh cycle is slowed to ⅛ of the normal refresh mode (A). Due to this fact, the refresh cycle of an advanced refresh operation AR is slowed to ⅛ (×0.25).

Similarly, in a 1/12 refresh mode (D), a refresh cycle is slowed to 1/12 of the normal refresh mode (A). Due to this fact, the refresh cycle of an advanced refresh operation AR is slowed to 1/12 (×0.17).

The timing diagram of FIG. 5 is a diagram for explaining AR2.5× and SR0.5× operations.

Referring to the timing diagram of FIG. 5, in a normal refresh mode (A), during one cycle of a fresh operation, an advanced refresh operation AR is performed 2.5 times (×2.5), and a smart refresh operation SR is performed four times (×0.5).

In a ¼ refresh mode (B), a refresh cycle is slowed to ¼ of the normal refresh mode (A). Due to this fact, the refresh cycle of an advanced refresh operation AR is slowed to ¼ (×0.75).

In a ⅛ refresh mode (C), a refresh cycle is slowed to ⅛ of the normal refresh mode (A). Due to this fact, the refresh cycle of an advanced refresh operation AR is slowed to ⅛ (×0.3125).

Similarly, in a 1/12 refresh mode (D), a refresh cycle is slowed to 1/12 of the normal refresh mode (A). Due to this fact, the refresh cycle of an advanced refresh operation AR is slowed to 1/12 (×0.21).

In this way, in an embodiment, by flexibly adjusting the number of times by which the bank 150 is refreshed, depending on the number of times by which the refresh signal REF is inputted, various advanced refresh operations may be implemented. The numbers of times illustrated in FIGS. 3 to 5, by which a refresh operation is performed, are nothing but examples, and the embodiments are not limited thereto. The number of times by which refresh is performed may be changed variously.

Figure 6:
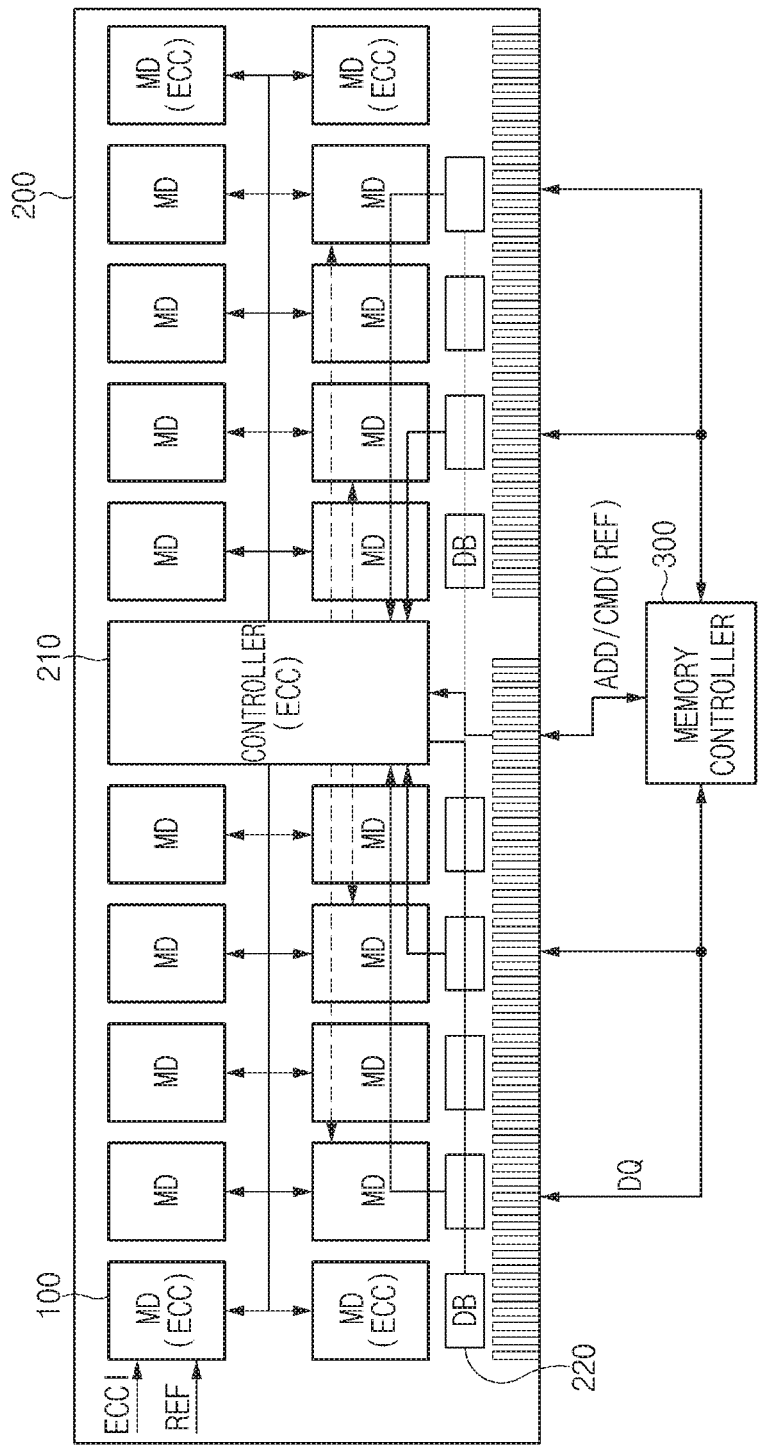
FIG. 6 is a configuration diagram illustrating a representation of an example of a memory module in accordance with an embodiment.

FIG. 6 is a configuration diagram illustrating a representation of an example of a memory module in accordance with an embodiment.

A memory module 200 in accordance with the embodiments of FIG. 6 include a plurality of semiconductor devices (MD) 100, a controller 210 and a plurality of data buffers (DB) 220.

The memory module 200 operates in response to a request of a memory controller 300. The controller 210 manages data DQ accessed by the memory controller 300, by storing them in the semiconductor devices 100.

In a present embodiment, the memory module 200 may be a DIMM (dual in-line memory module). Each of the plurality of semiconductor devices 100 may be constructed by the semiconductor device 100 illustrated in FIG. 1. For instance, such a semiconductor device 100 may be implemented in the form of a stacked memory in which a plurality of memories are stacked shown in FIG. 7.

Figure 7:
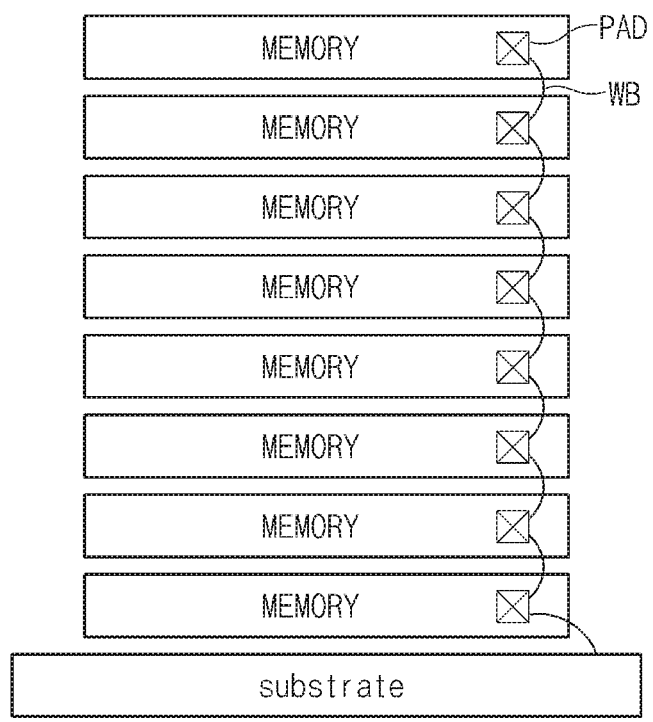
FIG. 7 is a detailed diagram illustrating a representation of an example of a structure of each semiconductor device shown in FIG. 6.

Referring to FIG. 7, the semiconductor device 100 may include a plurality of memory and a substrate. The plurality of memory may be sequentially stacked over the substrate. Each of the memories may receive a command, a data and an address from the substrate through its own pads PAD. The plurality of memory may be coupled to each other through a wire bonding WB or through-silicon vias (TSVs). Although the embodiment of FIG. 7 has exemplarily disclosed that each semiconductor device 100 includes 8 memories for convenience of description, the number of memory is not be limited thereto and can also be changed to another number without departing from the scope or spirit of the present disclosure.

In FIG. 6, total 20 semiconductor devices 100 are illustrated on the board of the memory module 200, with 10 semiconductor devices 100 placed at each of the left and right sides of the controller 210. However, it is to be noted that the embodiments are not limited thereto, and the number of semiconductor devices 100 mounted onto the memory module 200 is not limited.

In order to improve the degree of integration of a semiconductor device, a 3DS (three-dimensionally stacked) semiconductor device, in which a plurality of memory (or chips) are stacked and packaged in a single package, has been developed. Since the 3DS semiconductor device includes the plurality of memories, the 3DS semiconductor device is configured in such a manner that each memory is identified by an electrical signal to allow a specific memory to be selected.

The 3DS semiconductor device may use through-silicon vias (TSV) to transfer signals among the respective memories. Memories may be stacked not by using through-silicon vias but by using wire bonding WB the cost of which is relatively inexpensive. The scaling of a semiconductor device (for example, a DRAM) gradually approaches a limit, and a need for a high capacity memory is increasing due to extension to a data center, etc. In this consideration, a semiconductor device may be implemented in the form of a stacked memory in which DRAM chips are stacked and are wire-bonded to increase a memory capacity.

In this way, in the case where the plurality of semiconductor devices 100 are included in one memory module 200, current consumption may increase. Therefore, in order to reduce the consumption of refresh current in each semiconductor device 100, the semiconductor device 100 of FIG. 1 may be applied as described above. In the case where current consumed in each semiconductor device 100 is reduced, the power consumption of the memory module 200 may be reduced as a result.

The memory module 200 receives various signals for controlling the semiconductor devices 100, for example, an address ADD, a command signal CMD and data DQ, from the external memory controller 300. The memory controller 300 may be a processor, for example, such as a central processing unit (CPU), an application processor (AP) and a graphic processing unit (GPU).

The controller 210 controls a write or read operation to be performed, by providing the command signal CMD, the address ADD and the data DQ to the respective semiconductor devices 100. The controller 210 may exchange the information of the respective semiconductor devices 100 with the memory controller 300.

The command signal CMD which is provided to the controller 210 from the memory controller 300 may include a refresh command which activates a refresh signal REF. The controller 210 may control the refresh operation of each semiconductor device 100 in response to a refresh command among various command signals CMD applied from the memory controller 300. That is to say, each semiconductor device 100 may be controlled in its refresh operation by refresh mode information applied from the controller 210.

The controller 210 stores information related with operation states, characteristics, capacities, performance parameters, etc. for the semiconductor devices 100, and controls the semiconductor devices 100 by referring to the data stored therein, in a control operation. The controller 210 may map and manage the data allocated to the semiconductor devices 100, and may update the data depending on the characteristics of the data.

The controller 210 may include an ECC for correcting an error bit. The controller 210 may process the data applied from the memory controller 300, by the ECC, and may store processed data.

The data buffers 220 may buffer the data DQ applied from the memory controller 300 and transfer buffered data to the controller 210, and may buffer the data applied from the controller 210 and transfer buffered data to the memory controller 300.

Some semiconductor devices 100 among the plurality of semiconductor devices 100 may include ECC processing circuits which store parity bits to correct error bits. Each semiconductor device 100 corrects an error through the ECC in the case where a bit failure occurs therein. In the case where many spaces for storing parity bits are needed, the memory module 200 may allocate ECCs for correcting errors, to some semiconductor devices 100, in addition to the controller 210. In other words, the controller 210 may transmit and receive data DQ requested from the memory controller 300 and parity data for correcting the errors of the data DQ, to and from the semiconductor devices 100, by performing an ECC operation.

In an embodiment, it is illustrated as an example that ECCs are included in the controller 210 and the semiconductor devices 100. However, it is to be noted that the embodiments are not limited thereto, and ECCs may be separately positioned outside the controller 210 and the semiconductor devices 100.

In the case where the memory module 200 is implemented in this way, current consumption cannot help but increase. Therefore, overall current to be consumed in the memory module 200 should be reduced. In this consideration, in a present embodiment, refresh cycles are differently controlled by the characteristics of the semiconductor devices 100 depending on ECC capability values.

Namely, in a present embodiment, ECC information ECCI which are set to different values in correspondence to the error bit repair probabilities of the respective semiconductor devices 100 are stored. If the refresh signal REF is applied to each semiconductor devices 100 through the memory controller 300 and the controller 210, a refresh operation is performed.

Each semiconductor device 100 adjusts a refresh cycle in correspondence to the ECC information ECCI which is set in advance, when the refresh signal REF is activated. In an embodiment, in the case where an ECC capability value is high in correspondence to the ECC information ECCI, the refresh operation of the semiconductor device 100 may be skipped, and thereby, current to be consumed may be reduced. In the case where current to be consumed in each semiconductor device 100 is reduced, overall current to be consumed in the memory module 200 which includes the plurality of semiconductor devices 100 may be reduced.

In an embodiment, a refresh mode corresponding to the ECC information ECCI is set in the register 110 (see FIG. 1) of each semiconductor device 100. Due to this fact, in an embodiment, since a refresh cycle is changed internally of each semiconductor device 100 in correspondence to the ECC information ECCI set in advance, it may be possible to control the refresh operation of the semiconductor device 100 without changing the function of the external memory controller 300.

In an embodiment, it is described as an example that the memory module 200 may be applied to a DIMM. However, it is to be noted that the embodiments are not limited thereto, and the memory module 200 may be constructed by a UDIMM (unbuffered dual in-line memory module), an RDIMM (registered dual in-line memory module), an FBDIMM (fully buffered dual in-line memory module), an LRDIMM (load reduced dual in-line memory module) or other memory modules.

While various embodiments have been described above, it will be understood to those skilled in the art that the embodiments described are by way of example only. Accordingly, the semiconductor device and the memory module including the same described herein should not be limited based on the described embodiments.

What is claimed is:

1. A semiconductor device comprising:
   a register configured to store an error correction code information, and output a first mode signal for controlling a refresh cycle differently in correspondence to the error correction code information and a second mode signal for constantly controlling the refresh cycle regardless of the error correction code information;
   a counter configured to count a refresh signal and output a counting signal;
   a mode control circuit configured to receive the first mode signal and the second mode signal, configured to output an advanced refresh signal in which the refresh cycle is adjusted, by controlling the counting signal depending on the first mode signal, and configured to output a smart refresh signal which has a constant refresh cycle, in correspondence to the second mode signal; and
   a refresh control circuit configured to output a bank address for performing a refresh operation that is set in correspondence to the advanced refresh signal and the smart refresh signal, to a bank.

2. The semiconductor device according to claim 1, wherein the first mode signal includes advanced refresh mode information.

3. The semiconductor device according to claim 1, wherein the second mode signal includes smart refresh mode information.

4. The semiconductor device according to claim 1, wherein the register sets a refresh mode in a mode register set.

5. The semiconductor device according to claim 1, wherein the error correction code information is set to a different value in correspondence to an error bit repair probability.

6. The semiconductor device according to claim 1, wherein the register additionally stores FGR (fine granularity refresh) mode information.

7. The semiconductor device according to claim 1, wherein the register additionally stores TCAR (temperature controlled auto refresh) mode information.

8. The semiconductor device according to claim 1, wherein the mode control circuit comprises:
   an advanced refresh mode control circuit configured to control the advanced refresh signal depending on the first mode signal corresponding to the error correction code information; and
   a smart refresh mode control circuit configured to control the smart refresh signal in correspondence to the second mode signal for constantly controlling a refresh cycle.

9. The semiconductor device according to claim 8, wherein the advanced refresh mode control circuit recognizes only some refresh signals among a plurality of refresh signals in correspondence to the counting signal, and thereby, controls the advanced refresh signal to be activated intermittently.

10. The semiconductor device according to claim 8, wherein the smart refresh mode control circuit cyclically activates the smart refresh signal in correspondence to a row hammer characteristic.

11. A memory module comprising:
   a plurality of semiconductor devices configured to perform a write or read operation in correspondence to a command signal, an address, and data; and
   a controller configured to store and manage the data to be accessed, in the plurality of semiconductor devices,
   wherein a refresh cycle in each of the plurality of semiconductor devices is differently set depending on error correction code information corresponding to error correction codes,
   wherein each of the semiconductor devices comprises:
   a register configured to store the error correction code information, and output a first mode signal for controlling a refresh cycle differently in correspondence to the error correction code information and a second mode signal for constantly controlling the refresh cycle regardless of the error correction code information; and
   a mode control circuit configured to output an advanced refresh signal in which the refresh cycle is adjusted, by controlling a counting signal depending on the first mode signal, and output a smart refresh signal which has a constant refresh cycle, in correspondence to the second mode signal.

12. The memory module according to claim 11, further comprising:
   a plurality of data buffers configured to buffer the data.

13. The memory module according to claim 11, wherein each of the plurality of semiconductor devices is a stacked memory in which a plurality of memories are stacked.

14. The memory module according to claim 13, wherein the stacked memories are coupled by using any one of through-silicon vias and wire bonding.

15. The memory module according to claim 11, wherein some semiconductor devices among the plurality of semiconductor devices are configured to use error correction codes for correcting an error bit of the data.

16. The memory module according to claim 11, wherein the error correction codes are stored within the controller.

17. The memory module according to claim 11, wherein each of the semiconductor devices further comprises:
   a counter configured to count a refresh signal and output the counting signal; and
   a refresh control circuit configured to output a bank address for performing a refresh operation that is set in correspondence to the advanced refresh signal and the smart refresh signal, to a bank.

18. The memory module according to claim 17,
   wherein the first mode signal includes advanced refresh mode information, and
   wherein the second mode signal includes smart refresh mode information.

19. The memory module according to claim 17, wherein the register stores at least any one type of information of FGR (fine granularity refresh) mode information and TCAR (temperature controlled auto refresh) mode information, in a mode register set.

20. The memory module according to claim 17, wherein the error correction code information is set to a different value in correspondence to an error bit repair probability.

* * * * *